United States Patent [19]

Detig et al.

[11] Patent Number: 5,011,758
[45] Date of Patent: * Apr. 30, 1991

[54] USE OF A LIQUID ELECTROPHOTOGRAPHIC TONER WITH AN OVERCOATED PERMANENT MASTER IN ELECTROSTATIC TRANSFER

[75] Inventors: Robert H. Detig, Berkeley Heights; David P. Bujese, Butler, both of N.J.

[73] Assignee: Olin Hunt Specialty Products Inc., West Paterson, N.J.

[*] Notice: The portion of the term of this patent subsequent to Aug. 22, 2006 has been disclaimed.

[21] Appl. No.: 387,044

[22] Filed: Jul. 31, 1989

Related U.S. Application Data

[63] Continuation-in-part of Ser. No. 160,254, Feb. 25, 1988, Pat. No. 4,859,557.

[51] Int. Cl.⁵ .............................................. G03G 13/22
[52] U.S. Cl. .................................... 430/100; 430/126; 430/31; 430/67; 430/319
[58] Field of Search ................. 430/31, 55, 67, 100, 430/126

[56] References Cited

U.S. PATENT DOCUMENTS

| | | |
|---|---|---|
| T. 869,004 | 12/1969 | Culhane . |
| 2,097,233 | 10/1937 | Meston . |
| 2,637,651 | 5/1953 | Copley . |
| 2,833,930 | 5/1958 | Walkup . |
| 2,910,351 | 10/1959 | Szpak et al. ............... 427/14.1 X |
| 2,966,429 | 12/1960 | Barrel et al. . |
| 3,071,070 | 1/1963 | Matthews et al. . |
| 3,267,840 | 8/1966 | Honma et al. . |
| 3,271,146 | 9/1966 | Robinson ........................ 430/126 |
| 4,047,945 | 9/1977 | Pfister et al. . |
| 4,373,016 | 2/1983 | Kings et al. ..................... 430/126 |
| 4,433,038 | 2/1984 | Nishikawa ........................ 430/55 |
| 4,457,993 | 7/1984 | Nishikawa ..................... 430/55 X |
| 4,686,163 | 8/1987 | Ng et al. ............................ 430/47 |
| 4,732,831 | 3/1988 | Riesenfeld et al. ......... 430/126 X |

OTHER PUBLICATIONS

Xerography and Related Processes–John H. Dessauer and Harold E. Clark–pp. 395–398.

*Primary Examiner*—Roland E. Martin
*Attorney, Agent, or Firm*—Ralph D'Alessandro

[57] ABSTRACT

A method of using a liquid electrophotographic toner with a permanent master to electrostatically transfer a electrophotographically developed electrostatic image via a reversal photographic process from the permanent master to a receiving surface is disclosed. The permanent master is made from a multilayer plate of a photopolymer material and a protective overcoated material whose surface is hard, low friction and acts as a physical and chemical barrier.

28 Claims, 3 Drawing Sheets

CORONA CHARGE

PHOTOPOLYMER LAYER

PROTECTIVE OVERCOAT

TONER PARTICLES

USE OF A LIQUID ELECTROPHOTOGRAPHIC TONER WITH AN OVERCOATED PERMANENT MASTER IN ELECTROSTATIC TRANSFER

This application is a continuation-in-part of application Ser. No. 160,254, filed Feb. 25, 1988, now U.S. Pat. No. 4,859,557, issued Aug. 22, 1989.

This invention relates generally to a method of high resolution electrostatic transfer of a high density image to a receiving surface. More specifically, it pertains to the use of a liquid electrophotographic toner with a permanent master made from a photopolymer material to transfer a developed image from a master overcoated with a dielectric material to the receiving substrate. The permanent master may be repeatedly used to produce high resolution and high density images on receiving surfaces, while the photopolymer material is protected by the overcoated material.

The production of conductive wiring patterns on an insulating substrate employing a dry film resist by use of photoimaging and other techniques to produce a printed circuit board typically employs a five step process. Regardless of whether a tenting method or a hole-plugging method is employed, the five distinct steps have included laminating or coating a photopolymer dry film resist on at least one conductive surface of an insulating substrate, forming a wiring pattern on the dry film resist by use of artwork or a phototool and exposing the dry film resist to actinic radiation through the transparent areas of the phototool, developing the circuit board by removing the unexposed portions of the negative working dry film resist, etching the conductive substrate from the circuit board in all non-imaged areas not beneath the desired conductive wiring pattern which is still covered with the dry film resist, and finally stripping or removing the dry film resist covering the desired wiring pattern from the non-etched portions of the conductive substrate. This five step process must be repeated for each circuit board produced.

During the exposure step in the standard dry film process, sufficient radiation exposure levels and exposure times are desired to produce straight sidewalls in the dry film resist that are the result of a pattern of the cross-linking of polymers in the dry film. These straight sidewalls should be normal to the conductor surface. Practically, however, for example in the standard negative working dry film photoresist print and etch process, either underexposure occurs, producing a sidewall edge that undercuts the desired resist pattern, or overexposure occurs, producing a sidewall edge in the dry film photoresist that increases the width of the dry film photoresist at the base of the resist and the surface of the conductor causing a foot. Both of these conditions vary the width of the ultimate conductive pattern from that which is desired, beyond the planned and engineered tolerance or overage of the line widths in the conductor surface.

The development step during this process ideally should dissolve away the unexposed and, therefore, uncross-linked areas of the negative working dry film resist to produce an edge in the dry film resist on the conductor surface that is equal in width to the pattern on the phototool and normal to the conductor surface. Practically, however, either underdevelopment or overdevelopment of the dry film photoresist occurs. Underdevelopment produces a buildup of resist residue in the sidewall zone or developed channels that is sloped toward the adjacent sidewall, resulting in smaller spaces between the adjacent lines than is desired. When overdevelopment occurs the unexposed film resist edge is undercut, producing larger than desired spacing between adjacent lines. Additionally, there is the potential for some rounding at the top of the resist surface sidewall edges.

This inability to accurately reproduce the phototool throughout the thickness of the dry film resist affects the fine line resolution and reproduction characteristics of the reproduced circuit pattern. As circuit boards have become more complex and stacking of multiple boards has become prevalent, the need for higher density, finer resolution circuit patterns has evolved. Resolution has been viewed as the ability to reliably produce the smallest line and space between adjacent lines that can be reliably carried through the aforementioned five step processing. The thinness or smallness of the lines that can survive development and the narrowness of the gap or space between the adjacent lines in the circuit pattern have led to fine line resolution and reproduction standards in the printed circuit board industry which are used to define the desired density of the circuit board. The desired density is expressed in lined and space dimensions or a specific number of line pairs per millimeter. The fact that circuit boards consist of a nonporous or nonabsorbent substrate, such as metal, like copper, or a plastic, like the polyester film sold under the tradename of MYLAR, has made it difficult to apply the principles of xerography to effect the transfer of high resolution and high density images from a developed electrostatic latent image to a receiving surface, such as a circuit board. This nonporous and nonabsorbent receiving surface causes the image being transferred, especially when attempted with a liquid toner, to become distorted or "squished".

Also, it has been found with nonporous receiving substrates that both the photoconductor or electrostatically imageable surface and the receiving conductive surface must be stationary at the point of transfer of the toner image to achieve a transferred image of high resolution.

An additional problem is presented in transferring the developed latent image electrostatically to a nonabsorbent substrate, such as copper. The metal or copper surface forming the conductive receiving surface, as well as the electrostatically imageable surface, is uneven so that the spacing between the electrostatically imageable surface and the conductive receiving surface must be sufficient to avoid contact between the uneven surfaces of the photoconductor and the conductive receiving surface.

The use of a liquid electrophotographic toner repeatedly with the same permanent master presents a further problem because the toner or the carrier liquid could conceivably attack the photopolymer material. Where the toner particles are carried in a nonpolar insulating solvent, such as that having branched-chain aliphatic hydrocarbons sold under the tradename ISOPAR by Exxon Corporation, the repeated use of the same master can result in the leaching out of sensitizers or plasticizers from the photopolymer master into the toner bath supply, contaminating this supply. This can lead to a change in the electrical charge characteristics of the toner.

The electrical charge retention characteristics of the latent image in the photopolymer master can also be changed by continuous or extended exposure to ISOPAR ® solvent.

Attempts to prolong the useful life of a latent image or the substrate on which the latent image is formed have previously used a protective insulating layer of material over the photoconductor material. Representative processes employing this approach include the Canon NP process and the Katsuragawa process. These processes employed the use of a transparent protective insulating layer, but not in conjunction with a photopolymer that could be exposed to form a permanent master. These processes utilized polyethylene terephthalate as a solvent resistant layer on a cadmium sulfide drum or fine particles of cadmium sulfide in an elastomeric, resinous binder.

These problems are solved in the process of the present invention by providing a method of making a permanent latent image on a permanent master by using a protective overcoat material on the photopolymer master material, such as a liquid or a dry film resist. The permanent latent image on the photopolymer material is used to transfer a liquid electrophotographically developed electrostatic latent image from the electrostatically imaged surface of the permanent master to a receiving surface. The receiving surface can be a conductive, nonabsorbent, and nonporous receiving surface of the type used to produce multiple printed circuit boards with a desired conductive pattern. Transfer can also be made to paper or a laminate of the type suitable for color printing or proofing applications using this method.

It is an object of the present invention to provide a method for achieving high resolution electrostatic transfer of a liquid electrophotographic toner-developed high density electrostatic latent image from a permanent master directly to a receiving substrate.

It is another object of the present invention to obtain a high density electrostatic latent image on an electrostatically imageable surface through the use of a liquid electrophotographic toner with a dry film resist that serves as a permanent and reusable master.

It is another object of the present invention that the method of electrostatic transfer can be utilized with a liquid electrophotographic toner on a permanent master that serves as the electrostatically imageable surface.

It is yet another object of the present invention to provide a permanent master and a method of making a permanent master that can be used with a liquid electrophotographic toner to produce multiple copies of the desired resist pattern on a conductive substrate in preparation for etching to ultimately produce the conductive circuit wiring pattern on printed circuit boards, or to produce multiple copies of a desired pattern on paper or a laminate of the type suitable for color printing or proofing applications.

It is a feature of the present invention that a protective overcoated material, which is abrasion resistant and a low friction surface, is applied to the photopolymer material of the permanent master.

It is another feature of the present invention that the protectively overcoated photopolymer material of the permanent master is charged after the latent image is formed by exposure to actinic radiation and that the charge is retained on the protective overcoated material above the unexposed areas.

It is yet another feature of the present invention that the conductive backing material or the substrate supporting the permanent master is electrically grounded and the conductive receiving surface is electrically grounded during the electrostatic transfer.

It is still another feature of the present invention that the difference in conductivity of the photopolymer, such as a dry film photoresist, between the imaged and non-imaged areas on the master is employed to form a permanent electrostatic latent image wherein the exposed or non-imaged areas are more resistive than the unexposed or imaged areas.

It is another feature of the present invention that the permanent latent image and the protective overcoated material are electrostatically charged, developed with a liquid electrophotographic toner applied to the protective overcoated material, the liquid toner is retained above the unexposed areas (imaged areas) of the photoresist and then is transferred to a receiving surface.

It is another feature of the present invention that the transfer of the liquid electrophotographic toner may be either a transfer across a liquid-filled gap or a contact transfer from the protective overcoated material to the receiving substrate, which can be either conductive or nonconductive.

It is still another feature of the present invention, using a permanent master as the electrostatically imageable surface, that the electrostatic latent image on the electrostatically imageable surface is permanent and reusable as a master without the need for reexposure of the photopolymer to produce large quantities of printed circuit boards or printed copies on paper.

It is an advantage of the method of the present invention that high resolution transfer of the liquid electrophotographic toner particles forming the transferred image is obtained on the receiving surface without image distortion.

It is another advantage of the present invention that there is no damage or abrasion to the permanent master that is the electrostatically imaged surface during the transfer process with the liquid electrophotographic toner so that the surface may be continually reused.

It is still another advantage of the present invention that repeated high resolution transfer is achieved with the use of liquid electrophotographic toner particles on the protective overcoated material applied over the permanent master.

It is yet another advantage of the present invention that the soft photopolymer material used to form the permanent master is protected from physical damage by the protective overcoated material which acts as both a physical and chemical barrier.

It is still another advantage of the present invention that a faster and lower cost method of making printed circuit boards is achieved because of the elimination of the repeated exposure and development steps required of dry film or liquid photoresists for each circuit board.

These and other objects, features and advantages are obtained by the use of a permanent master and the method of fabricating a toned pattern on an electrically isolated receiving surface by first establishing an electrostatic latent image on a photopolymer material or electrostatically imageable surface which is used as a permanent master. The electrostatically imageable surface is covered with a protective overcoated material and is charged. Charged toner particles suspended in a liquid carrier are then developed to an area on the protective overcoated material covering the unexposed photopolymer material of the master, dependent upon the time elapsed between charging and development, the duration of the charging and the time constant of the exposed and unexposed areas, and are then transferred to the receiving surface.

The objects, features and advantages of the invention will become apparent upon consideration of the following detailed disclosure of the invention, especially when it is taken in conjunction with the accompanying drawings wherein.

Figure 4:
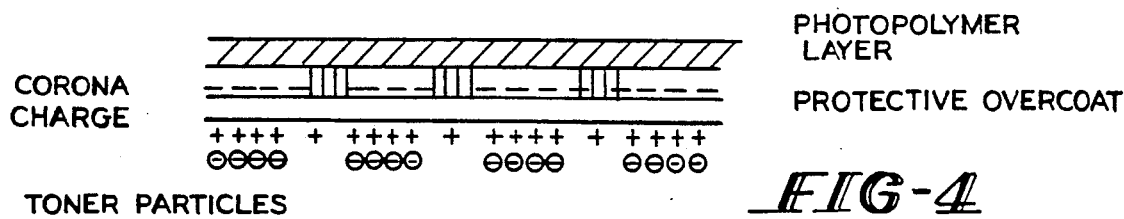
Figure 3:
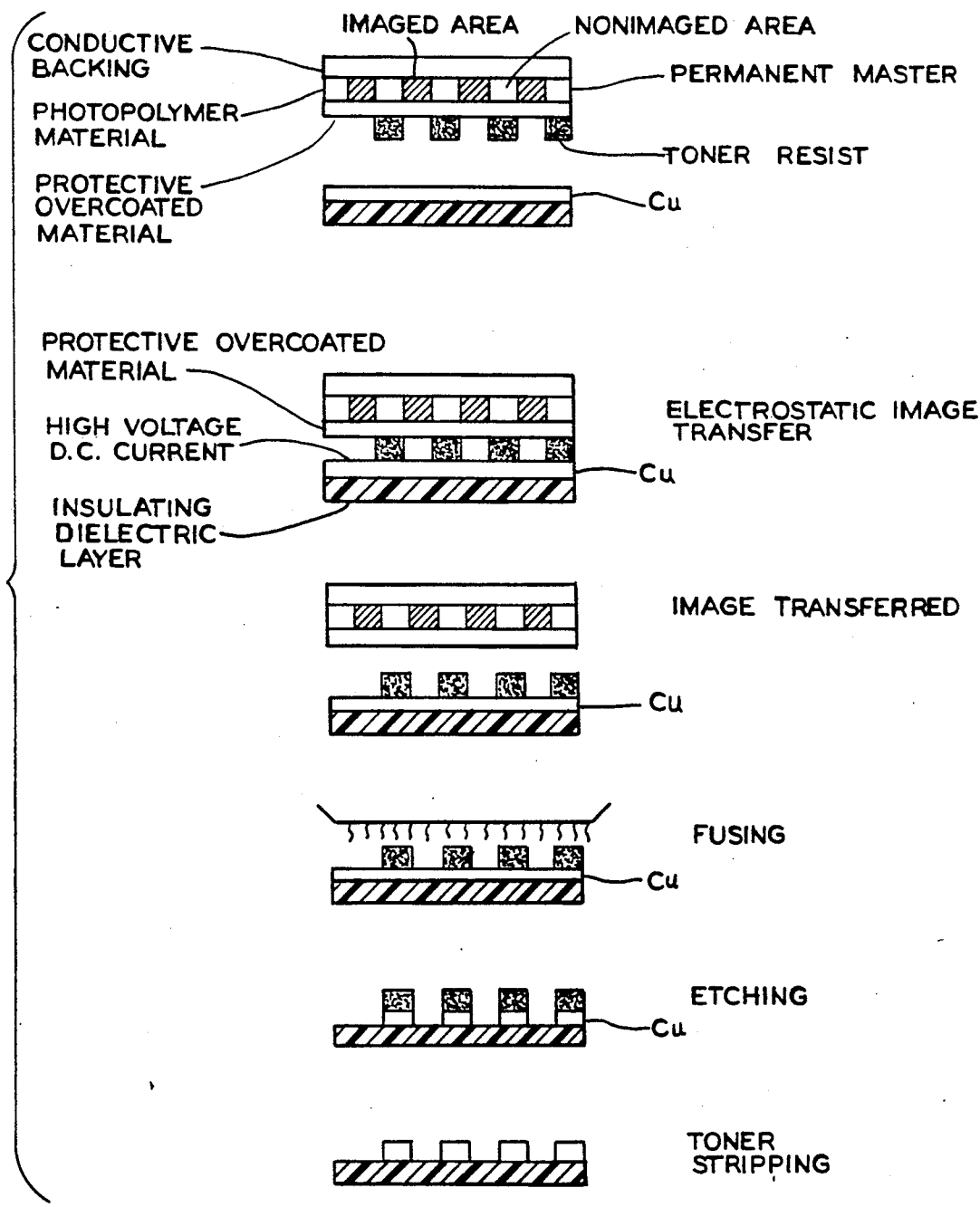

FIG. 3 is a diagrammatic illustration of the process of the present invention employing a permanent master that is protectively overcoated to show how the charged toner particles are positioned on the overcoated material over the unexposed photopolymer areas and are transferred from the master to a conductive receiving surface; and FIG. 4 is a diagrammatic illustration of the charges on the exposed and the unexposed areas of the protective overcoated material that covers the photopolymer material that is used to make the permanent master.

Figure 1:
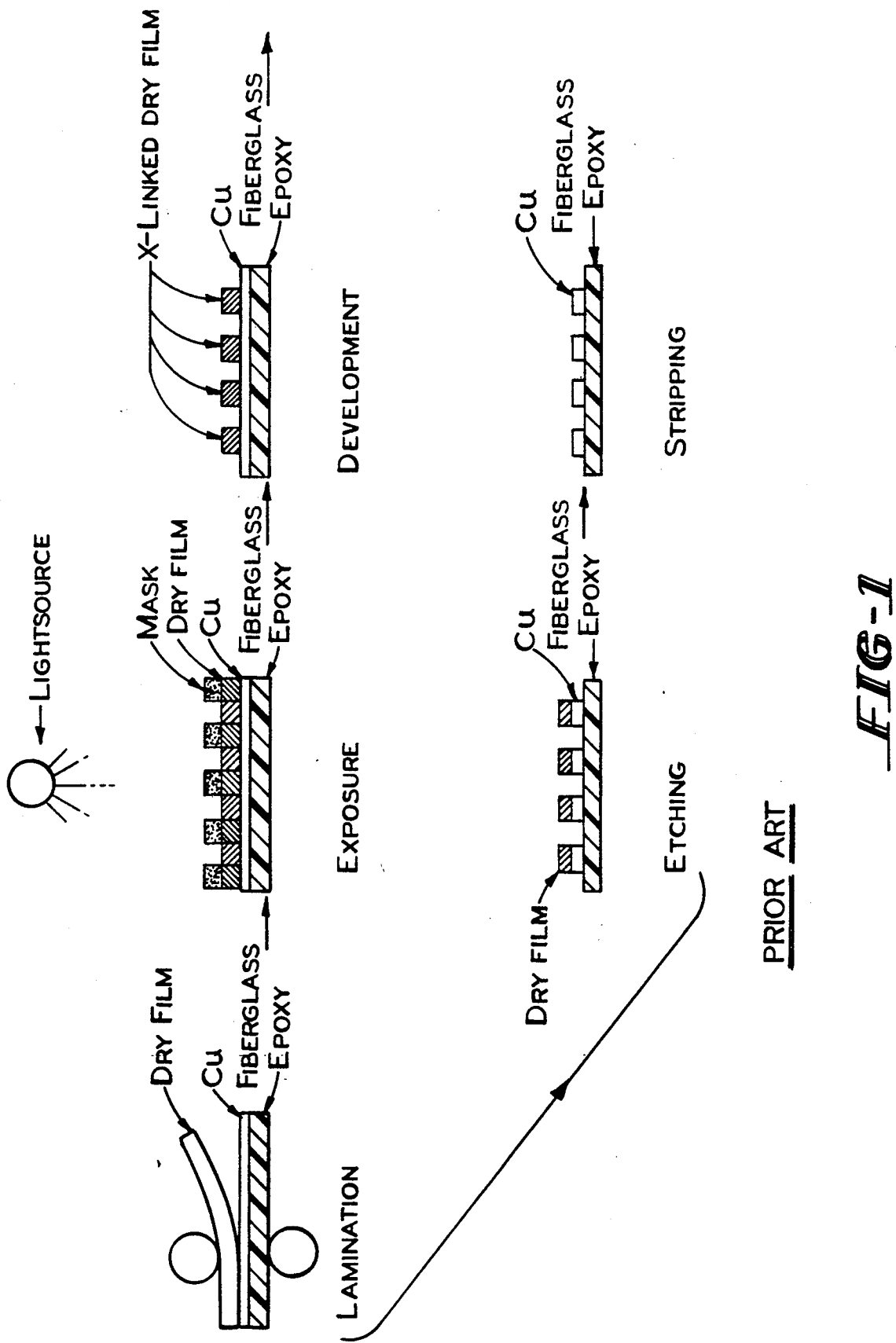
FIG. 1 is a diagrammatic illustration of the prior art print and etch printed circuit board fabrication steps.

FIG. 1 shows the standard five step process that has been previously employed in the production of printed circuit boards. Each one of the circuit boards produced has routinely required the application of a dry film to a conductive substrate, such as copper, that is laminated to a nonconductive substrate, such as fiberglass epoxy, with pressure and heat. A mask is then applied over the dry film to permit selective exposure from a light source or other source of actinic radiation to produce the desired pattern. Development takes place by removing the uncross-linked dry film, leaving only cross-linked dry film with the desired pattern. Etching with an acid etchant removes the conductive copper substrate from between the areas of cross-linked dry film. Finally, stripping the dry film from the remaining conductive copper substrate exposes the desired circuit pattern. This is commonly known as the print and etch process.

In the process of the present invention, however, a permanent master is produced for use with a liquid electrophotographic toner by the use of a photopolymer material or coating, such as a dry film or liquid photoresist over a conductive substrate. A protective overcoated material is applied over the photopolymer material. Thereafter, dry film or liquid photoresist is not employed to produce the desired conductive wiring patterns from the permanent master on the product circuit boards.

Figure 2:
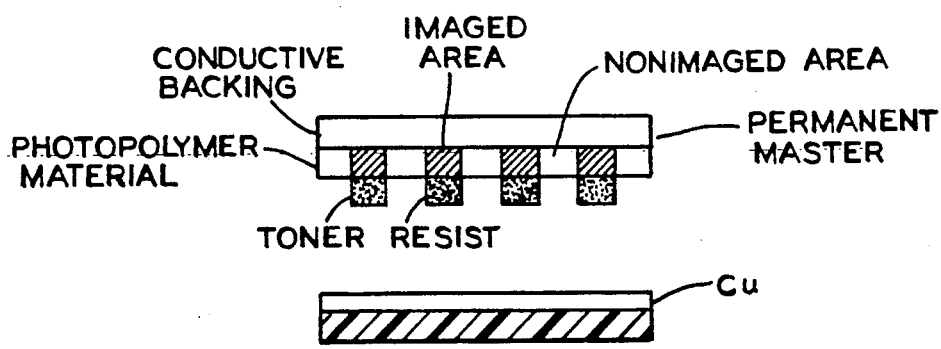
FIG. 2 is a diagrammatic illustration of the process of the present invention employing a permanent master that is not protectively overcoated to show how the charged toner particles would be positioned and transferred from the master to a receiving surface.
Figure 2:
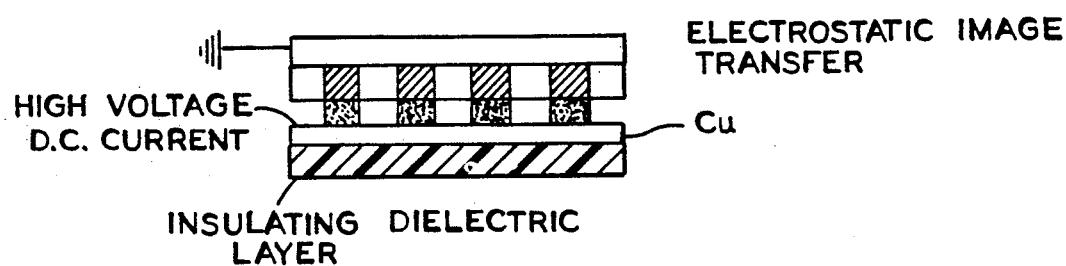
Figure 2:
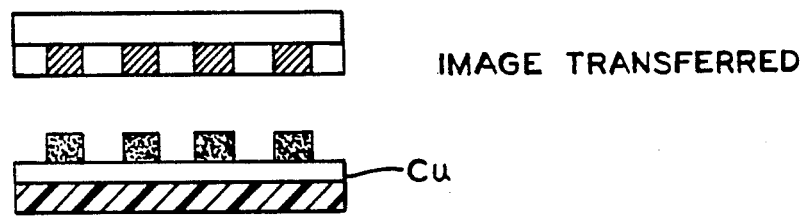
Figure 2:
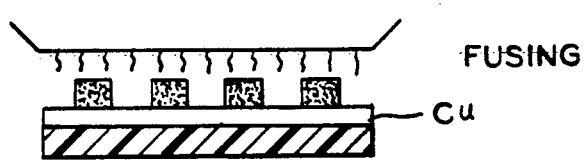
Figure 2:
Figure 2:

The permanent master is used as an electrostatically imageable surface as shown in FIGS. 2 and 3. A conductive backing has a photopolymer material, such as a dry film or liquid photoresist, applied to it on at least one side. This photopolymer material undergoes a change in resistivity upon exposure to actinic radiation because of the cross-linking of the polymers in the material. A permanent latent image is formed on the photopolymer material by actinicly radiating through a mask or by "writing" the desired pattern with a digital laser pen. Either method produces differences in the resistivity between imaged and non-imaged areas on the photopolymer material. The electrostatically imageable surface with the protective overcoated material, seen in FIG. 3, is isolated from ground and charged with a corona charging device to produce a pattern of charge retention that is the reverse of that obtained with the uncoated master, seen in FIG. 2, when the uncoated master is charged. The charge is retained on the protective overcoated material of FIG. 3 above the unexposed or less resistive areas.

The protective overcoated material is preferably a material having the properties of high dielectric constant, sufficient flexibility to conform to the surface to which it is mounted, resistance to solvent attack, a hard surface resistant to abrasion, and low surface energy (friction). A preferred material is polyethylene terephthalate (PET), but other suitable materials include polyvinyl fluoride, polyvinylidene fluoride, polyether polyurethane, polyester polyurethane, polybutylene terephthalate, polyoxymethylene, appropriate polyether imides and polyether ether ketone (PEEK). An appropriate thickness for the material can range from about 0.25 mils to about 10 mils. The preferred thickness range is from about 0.25 to about 3 mils. The thinner the material, the better is the resolution in the permanent latent image. The material must be transparent to permit actinic radiation to pass through to the underlying photopolymer material that forms the permanent master, if exposure occurs with the protective overcoated material already in place.

Alternately the protective overcoated material can be applied to the photopolymer material after it is exposed to form the permanent latent image. In this approach, the protective overcoated material does not need to be transparent, since the exposure occurs prior to the application of the protective overcoated material, such as by lamination. The protective overcoated material in this instance can include ultraviolet absorbers to protect the photopolymer from possible ultraviolet light attack. A suitable commercially available product possessing this property is Dupont's polyvinyl fluoride film sold under the tradename TEDLAR. The application of the protective overcoated material subsequent to exposure is the preferred technique when direct laser imaging is used.

The controlling factor in determining the type of protective overcoated material used and the timing of its application is the electrostatic contrast obtained in the master. This electrostatic contrast is determined by the thickness and the dielectric constant of the protective overcoated material compared to the photopolymer layer. Using a photopolymer having the thinnest possible thickness for the master, combined with the thinnest possible protective overcoated material, gives the optimal resolution qualities.

The electrostatically imageable surface, after exposure, is then developed by the application of liquid electrophotographic toner particles that are charged oppositely to the charge on the protective overcoated material covering the electrostatically imageable surface. It is necessary to wait a sufficient length of time after charging for the electric charge field to dissipate from above the exposed areas of the photopolymer material before applying the toner particles. The charged liquid electrophotographic toner particles are directed to the charged areas of the protective overcoated material over the unexposed areas of the electrostatically imageable surface to form or develop the latent image. The protective overcoated material protects the softer photopolymer material from physical damage.

Thus developed, the image is formed on the protective overcoated material's surface over the electrostatically imageable surface according to the permanent latent image's pattern on the permanent master. The developed image thus is ready for transfer to an electrically isolated conductive receiving surface to produce a circuit board with the desired conductive wiring pattern. Alternately, the developed image can be transferred to a nonconductive receiving surface, such as paper, in a xeroprinting process where a master with the permanent image which is mounted to a grounded conductive backing, is charged, developed by the application of toner particles and the developed image is electrostatically transferred to another receiving surface.

Appropriate liquid electrophotographic toners can be selected from either hydrocarbon based or aqueous based liquid toner carriers. Typical hydrocarbon based liquid carriers include those sold under the tradename ISOPAR, sold by Exxon Corporation. Liquid toners have a suitable coloring agent, such as carbon black, dyes, or pigments. A binder is included and includes alkyd resins or possibly polymers, such as polyethylene, or waxes to adhere the toners to the receiving surface, such as paper. An appropriate charge control agent, such as lecithin, zirconium octuate or calcium octuate, may be employed, dependent upon whether a positively or negatively charged master is used to fuse the image to the receiving surface. The toner particles suspended in the liquid carrier are ground to the desired particle size and charged. The optimum particle size is based on the charge to mass ratio that will achieve the desired resolution of the transferred toner particles.

Transfer of the developed image to a receiving surface is accomplished by corona charging the image with a positively charged corona having about a 6.5 KV voltage. The charge distribution pattern is shown in FIG. 4. The receiving surface is then brought into contact with the charged toned image or, in the case of transfer through a liquid-filled gap, is placed in close proximity to the charged toned image. Where the receiving surface is conductive, it is electrically connected to the conductive substrate of the master. The electric field generated by the positively charged liquid toner particles self-repels the toner particles, causing the toner particles to be repelled by the like charge to the receiving surface. This transfer is more fully explained in U.S. Pat. No. 3,004,860 to Gundlach, herein specifically incorporated by reference in pertinent part.

Traditional techniques of corona transfer or biased roller transfer allow transfer of liquid particle toner images to porous and or nonconductive receiving surfaces such as paper or plastic film.

The electrostatically imageable surface and the receiving surface, whether conductive or nonconductive, at the point of transfer should have no relative motion occurring between them, although the point of transfer could be a stationary or rolling point of transfer. A drum or web, or a stationary flat surface could be employed for the electrostatically imageable surface, transferring the developed image from the master to a flat and stationary, or a moving receiving surface. The moving receiving surface could be a rolling drum or a web or other appropriate means. The electrostatically imageable and receiving surfaces must be held in place at the point of transfer, such as by a vacuum, or alternately could be accomplished by magnetically or electrostatically holding the surfaces.

As is diagrammatically illustrated in FIG. 3, the charged liquid electrophotographic toner particles with their predetermined charge, migrate from the oppositely charged protective overcoated material above the uncross-linked area in the photopolymer material on the electrostatically imageable surface to the conductive receiving surface as individual or grouped particles. The conductive receiving surface is laminated onto an insulating dielectric layer, such as a fiberglass epoxy.

Since the photopolymer material, such as a dry film or liquid photoresist, on the electrostatically imageable surface acts as a master electrostatic image plate, and the resistivity difference between the imaged and non-imaged areas on the electrostatically imageable surface remains relatively constant in most instances for sustained periods of time dependent upon the photoresist used, multiple copies can be made by the electrostatic transfer method. To repeat the procedure, any residual electric charge on the electrostatically imageable area should be discharged, such as by charging the photopolymer material's surface with an alternating current corona.

The desired electrostatic latent image pattern remains in the photopolymer material by using the material's ability to retain differences in resistivity for relatively long periods of time after having been exposed to actinic radiation to form cross-linked areas of increased resistivity and areas unexposed to the actinic radiation which remain the less resistive areas. The photopolymer material, such as a dry film resist, typically is formed of polymers which become cross-linked to form the imaged areas of greater electrical resistivity that should be an order of magnitude or greater more dielectric than the background or unexposed areas, dependent upon the process speed of the image transfer. Faster process speeds will require greater resistivity differentials. Suitable dry film photoresists include those sold under the tradenames Riston 1215 and Riston 3615 by DuPont and BASF's 38 micron thick film supplied under the designation WN-0038. A liquid photopolymer could also be applied with a solvent to the conductive substrate, cured until dry, and then laminated with the protective overcoated material. The practical limitation in selecting the particular photopolymer is the time required for the electrical charge to migrate in the exposed areas from the photopolymer's substrate to the photopolymer-protective overcoated material interface. The time preferably is relatively short, such as about 1.25 seconds to about 10 seconds.

To obtain good electrostatic contrast for line or half tone images, the resistivity of the photopolymer material in the unexposed areas should be below $10^{12}$ ohm-centimeters. The exposed areas should typically have an electrical resistivity of at least $10^{13}$ ohm-centimeters. For comparative purposes, the resistivity of various materials, including some traditionally considered as insulating materials, are known. Electronic grade MYLAR polyester film has a resistivity of about $10^{17}$ ohm-centimeters, aluminum oxide ceramic about $10^{16}$ ohm-centimeters, various grades of mica from $10^{13}$ to $10^{17}$ ohm-centimeters, unexposed Dynachem AX dry film about $10^{13}$ ohm-centimeters, and various grades of Union Carbide's Bakelite copolymer plastics from about $10^7$ to $10^{16}$ ohm-centimeters. DuPont's Riston 3615 dry film has a resistivity of about $10^{10}$ ohm-centimeters.

When the photopolymer is overcoated with the dielectric layer of protective overcoated material, the imaged patterns of the resulting multilayer plate become the reverse of what occurs with just the uncoated photopolymer. Specifically, the overcoated dielectric layer over the unexposed (less resistive) areas of the photopolymer retains more charge than the overcoated dielectric layer over the exposed (more resistive) areas of the photopolymer. Therefore, a positive phototool must be used with an overcoated photopolymer master. The unexposed areas beneath the more charged retained and toner developed imaged areas of the protective overcoated material have the lesser electrical resistivity and are conductive. The resultant corona's charge potential appears across the combination of the protective overcoated layer and the unexposed photopolymer layer that comprise the multilayer plate. After a suitable time delay, as short as 1 to 2 seconds, the potential across the exposed photopolymer layer beneath the protective overcoated dielectric layer collapses or dissipates, leaving only that portion of the initial charge voltage or potential across the protective overcoated dielectric layer in the unexposed imaged areas.

Since the imaged areas on the protective overcoated material (corresponding to the unexposed photopolymer areas beneath the overcoated material) have the full charge voltage and the non-imaged areas on the protective overcoated material (corresponding to the image-wise exposed photopolymer areas beneath the overcoated material) have only a small portion of the full charge voltage or potential, the electrostatic contrast between the imaged and non-imaged areas has been established. This contrast can be maximized by varying the relative thicknesses and dielectric constants of the photopolymer material and protective overcoated material.

The charged liquid electrophotographic toner particles are oppositely charged to the charge retaining areas of the protective overcoated material over the unexposed photopolymer material so that the charged toner particles are attracted to them. This then permits the transfer of these charged toner particles from the electrostatically imageable surface to the receiving surface as previously described.

Once the toner image is formed by the toner particles in the imaged area on a receiving surface, the particles are fused to the conductive receiving surface by heating, as illustrated diagrammatically in FIGS. 2 and 3. The heat can be provided either by the use of an oven or directed warm air through an air slot so that the heat is supplied for a finite period of time sufficient to reach the temperature at which the binder or polymer forming the toner particles will solvate in the liquid which is entrained within the transferred image. The fusing, for example, can occur for about 15 to about 20 seconds at a temperature greater than about 100° C. and up to about 180° C.

Thereafter, for conductive receiving surfaces, the non-imaged areas are etched to produce the desired conductive wiring pattern in the unetched conductive receiver surface, which is overcoated with the toner particles. The etching step utilizes a solution that cannot remove the conductive material from the areas of the conductive receiving surface protected by the toner particles, but does attack and remove the conductive material from the areas unprotected by the toner particles. The particular type of etchant employed depends, in part, on the conductive material being etched and the type of resist being used, so that both acid and very mild alkaline etching solutions are possible for use. For example, when the conductive receiving surface is copper, an etchant comprising acidic cupric chloride is preferably used.

The final step in the electrostatic transfer process to form the copy on a conductive receiving surface is the stripping step. During this step the toner particles are appropriately removed or stripped from the imaged areas, such as by rinsing with methylene chloride, acetone, an alkaline aqueous solution or other suitable solution.

In order to exemplify the results achieved, the following examples are provided without any intent to limit the scope of the instant invention to the discussion therein. The examples are intended to illustrate the manner in which a permanent master with a permanent latent image on the electrostatically imageable surface can be obtained. The examples also illustrate the use of a negative working dry film photoresist as the permanent master in conjunction with a liquid electrophotographic toner to produce multiple copies on nonconductive receiving surfaces and conductive receiving surfaces. There is no need for the application of a dry film or liquid resist to each conductive receiving surface prior to the transfer of the developed latent image from the protective overcoated material covering the electrostatically imageable surface.

EXAMPLE I

About 1.5 mil thick DuPont Riston 3615 dry film photoresist was laminated to a metallic substrate that consisted of about a 1.35 mil thick copper layer on epoxy glass by use of a Western Magnum Model XRL-360 laminator made by Dynachem of Tustin, Calif. The lamination was carried out at a roll temperature of about 220° F. at a speed of about 6 feet per minute. The metallic substrate was electrically grounded. The laminated product was exposed through a positive phototool that was a 150 line screen half tone target to a level of about 230 millejoules per square centimeter.(i.e. The background areas were image-wise exposed to actinic radiation and the imaged areas were unexposed.) The top protective layer of about 1.0 mil thick polyethylene terephthalate, hereafter PET, film was not removed from the Riston material.

The master plate of exposed Riston dry film was then charged by using a positive corona charging unit with voltage of approximately 6.5 kilovolts. After a delay of about 2-3 seconds, the PET protectively overcoated Riston 3615 plate was developed by hand pouring Hunt liquid toner #15-13d, diluted to about 1 percent solids content, over the plate. This is the same toner formulation sold by Savin Corporation as Savin #870 toner.

The toner developed image was then electrostatically transferred to a sheet of copper clad laminate sold under the tradename KAPTON ® by E.I. DuPont. The transfer produced a high quality half tone image on the copper with a dot range of about 5% to about 95%. The transfer was effected by placing 75 micron thick PET gap spacing strips on each edge of the board. The copper receiving surface was wrapped around an aluminum drum and the drum was rolled over the toned image and the gap spacing strips. The gap was filled with either a clear diluent or a toner fluid, such as that sold commercially under the tradename ISOPAR G. The receiving copper surface was biased to +1500 volts with respect to the substrate of the master plate. The image was fused to the copper laminate by heating to about 120° C. for about 120 seconds.

EXAMPLE II

Using the same procedure as in Example I, about 1.5 mil thick DuPont Riston 3615 dry film is laminated to the metallic substrate using about a 1.35 mil thick copper layer on epoxy glass. This metallic substrate is electrically grounded. The lamination is accomplished by use of the same Western Magnum Model XRL-360 laminator using the same temperature settings and speeds. The laminated substrate is exposed with a 150 line screen half tone target positive phototool to a level of about 230 millejoules per square centimeter. Again, the top protective PET layer is not removed from the Riston dry film material.

The thus formed master laminated plate is then charged by means of a positive corona unit with a voltage level of approximately 6.5 kilovolts. After a delay of about 2-3 seconds the PET/Riston plate is developed by hand pouring the same toner as was used in Example I over the plate. The toner developed image is transferred to a resin coated non-porous paper, such as Kodak brand Ektaflex ® photo paper base stock. The paper is wrapped around an aluminum roll and the paper clad roll is then rolled over the toned and imaged plate and the gap spacing strips. The gap between the plate and the paper surface is filled with either a toner diluent, such as ISOPAR G, or a liquid toner itself. A voltage of +1500 volts applied to the aluminum roll holding the recovery sheet is sufficient to effect good image transfer. The toner is again fused after the paper is dried by heating to about 120° C. for about 120 seconds. This is repeated 5 additional times, with each copied sheet of paper producing the same high quality half tone image with a dot range of about 5% to about 95%.

COMPARATIVE EXAMPLE A

About 1.5 mil thick DuPont Riston 3615 dry film photoresist was laminated to a metallic substrate that consisted of about a 1.35 mil thick copper layer on epoxy glass by use of a Western Magnum Model XRL-360 laminator made by Dynachem of Tustin, Calif. The lamination was carried out at a roll temperature of about 220° F. at a speed of about 6 feet per minute. The metallic substrate was electrically grounded. The laminated product was exposed through a positive phototool that was a 150 line screen half tone target to a level of about 230 millejoules per square centimeter.(i.e. The background areas were image-wise exposed to actinic radiation and the imaged areas were unexposed.) The top protective layer of about 1.0 mil thick polyethylene terephthalate (PET) film was removed from the Riston material.

The master plate of exposed Riston dry film was then charged by using a positive corona charging unit with voltage of approximately 6.5 kilovolts. After a delay of about 2-3 seconds, the Riston 3615 plate was developed by hand pouring Hunt liquid toner #15-13d, diluted to about 1 percent solids content, over the plate. This is the same toner formulation sold by Savin Corporation as Savin #870 toner.

The toner developed image was then electrostatically transferred to a sheet of copper clad laminate sold under the tradename KAPTON ® by E.I. DuPont. The transfer was effected by placing 75 micron thick PET gap spacing strips on each edge of the board. The copper receiving surface was wrapped around an aluminum drum and the drum was rolled over the toned image and the gap spacing strips. The gap was filled with either a clear diluent or a toner fluid, such as that sold commercially under the tradename ISOPAR G. The receiving copper surface was biased to +1500 volts with respect to the substrate of the master plate. The image was fused to the copper laminate by heating to about 120° C. for about 120 seconds.

The transfer produced an unacceptable quality half tone image on the copper with a dot structure of about 95% and unacceptable image inversion of the image obtained in Example I. The fine detail of the master was lost due to the island effect which caused the 5% dots of Example I to become unacceptable 95% dots. The exposed regions became the charge retaining layer and the unexposed areas the background, so that a negative phototool would be required, without the use of the protective overcoat material, to effect a transfer of the desired pattern.

COMPARATIVE EXAMPLE B

About a 37 micron thick DuPont Riston 3615 dry film photoresist was laminated to a metallic substrate that consisted of about a 1.35 mil thick copper layer on epoxy glass by use of a Western Magnum Model XRL-360 laminator made by Dynachem of Tustin, Calif. The lamination was carried out at a roll temperature of about 220° F. at a speed of about 6 feet per minute. The metallic substrate was electrically grounded. The laminated product was exposed through a negative phototool of a printed wiring board having about 1 mm diameter pads and about 0.4 mm wide vias to a level of about 500 millejoules per square centimeter.(i.e. The background areas were image-wise exposed to actinic radiation and the imaged areas were unexposed.) The top protective layer of about 1.0 mil thick polyethylene terephthalate, hereafter PET, film was removed from the Riston material.

The master plate of exposed Riston dry film was then charged by using a positive corona charging unit of an Olivetti Copea II charging unit set to approximately 100 microamperes of total corona current to an 8"×13" copper plate. After a delay of about 2-3 seconds, the Riston 3615 plate was developed by hand pouring Hunt liquid toner #15-13d, diluted to about 1 percent solids content, over the plate. This is the same toner formulation sold by Savin Corporation as Savin #870 toner.

The toner developed image was then electrostatically transferred to a sheet of copper clad laminate sold under the tradename KAPTON ® by E. I. DuPont. The transfer was effected by placing 75 micron thick PET gap spacing strips on each edge of the board. The copper receiving surface was wrapped around an aluminum drum and the drum was rolled over the toned image and the gap spacing strips. The gap was filled with either a clear diluent or a toner fluid, such as that sold commercially under the tradename ISOPAR G. The receiving copper surface was biased to +1500 volts with respect to the substrate of the master plate. The image was fused to the copper laminate by heating to about 120° C. for about 120 seconds.

The transfer produced an unacceptable quality image because the fine vias did not develop and transfer as a result of the island effect which causes corona generated charges to be repelled from the tiny islands of charge after the initial accumulation of surface charges. The repulsion is a direct result of the electric fields that are parallel to the surfaces of the fine vias and which prevent further corona charges beyond the initial few from landing on the tiny islands. The pad images were successfully developed and transferred.

While the preferred methods in which the principles of the present invention have been incorporated is shown and described above, it is to be understood that the present invention is not to be limited to the particular details and methods thus presented, but, in fact, widely different means and methods may be employed in the practice of the broader aspects of this invention.

Having thus described the invention, what is claimed is:

1. A method of fabricating a toned pattern on an electrically isolated receiving surface, comprising the steps of:
   (a) coating a conductive substrate with a photopolymer material that will undergo an increase in resistivity upon exposure to a source of actinic radiation;
   (b) forming a permanent latent image on the photopolymer material by exposing to an actinic radiation source to form electrostatically contrasted non-imaged areas and an exposed latent image;
   (c) coating the photopolymer material with a low friction protective overcoated material;
   (d) charging the protective overcoated material so that a charge is retained above the unexposed areas of the photopolymer material;
   (e) developing the electrostatic latent image area by applying charged liquid electrophotographic toner particles to the protective overcoated material, the charged liquid electrophotographic toner particles being directed to the protective transparent overcoat material above the unexposed areas of the photopolymer material to form a developed image;
   (f) establishing an electric field between the photopolymer material and the receiving surface;
   (g) placing the receiving surface adjacent to the photopolymer material; and
   (h) transferring the developed image from the protective overcoated material at a point of transfer to the receiving surface to form non-imaged areas and a transferred toner particle image in an imaged area.

2. The method according to claim 1 further comprising the step of fusing the transferred toner particle image to the receiving surface.

3. The method according to claim 2 further comprising the steps of
   (a) etching the non-imaged areas of the conductive surface to remove the receiving surface from the non-imaged areas of the receiving surface; and
   (b) removing the toner particles from the imaged area of the receiving surface.

4. The method according to claim 1 further comprising coating the photopolymer material with transparent protective overcoated material prior to exposing to an actinic radiation source.

5. The method according to claim 1 further comprising including an ultraviolet absorber in the protective overcoated material to protect the underlying photopolymer material from ultraviolet light attack.

6. The method according to claim 1 further comprising using a nonconductive laminate on which is mounted the receiving surface.

7. The method according to claim 5 further comprising using a conductive receiving surface as the receiving surface.

8. The method according to claim 1 further comprising using a nonconductive receiving surface as the receiving surface.

9. The method according to claim 1 further comprising using a liquid photopolymer as the photopolymer material and drying it after coating the conductive substrate.

10. The method according to claim 1 further comprising using a dry film photoresist as the photopolymer material.

11. The method according to claim 1 further comprising using a material as the protective overcoated material selected from the group consisting of polyethylene terephthalate, polyvinyl fluoride, polyvinylidene fluoride, polyether polyurethane, polyester polyurethane, polybutylene terephthalate, polyoxymethylene, and polyether ether ketone.

12. A method of fabricating a toned pattern on an electrically isolated receiving surface, comprising the steps of:
   (a) coating a conductive substrate with a photopolymer material that will undergo an increase in resistivity upon exposure to a source of actinic radiation;
   (b) forming a permanent latent image on the photopolymer material by exposing to an actinic radiation source to form electrostatically contrasted unexposed areas and exposed areas;
   (c) coating the photopolymer material with a low friction protective transparent overcoated material;
   (d) charging the protective transparent overcoated material so that a charge is retained above the unexposed areas of the photopolymer material;
   (e) developing the electrostatic latent image area by applying to the protective transparent overcoated material charged liquid electrophotographic toner particles, the charged liquid electrophotographic toner particles being directed to the protective transparent overcoat material above the unexposed area of the photopolymer material to form a developed image;
   (f) establishing an electric field between the photopolymer material and the receiving surface;
   (g) placing the receiving surface adjacent to and in contact with the overcoated photopolymer;
   (h) transferring the developed image from the protective transparent overcoated material at a point of transfer to the receiving surface to form non-imaged areas and a transferred toner particle image in an imaged area; and
   (i) maintaining no relative motion between the overcoated photopolymer material and the receiving surface at the point of transfer during the transfer step.

13. The method according to claim 12 further comprising fusing the transferred toner particle image to the receiving surface.

14. The method according to claim 12 further comprising using a conductive receiving surface as the receiving surface.

15. The method according to claim 12 further comprising:
   (a) etching the non-imaged areas of the conductive surface to remove the receiving surface from the non-imaged areas of the receiving surface; and
   (b) removing the toner particles from the imaged area of the receiving surface.

16. The method according to claim 15 further comprising coating the photopolymer material with transparent protective overcoated material prior to exposing to an actinic radiation source.

17. The method according to claim 12 further comprising using a nonconductive laminate on which is mounted the conductive receiving surface.

18. The method according to claim 12 further comprising using polyethylene terephthalate as the protective overcoated material.

19. The method according to claim 12 further comprising including an ultraviolet absorber in the protective overcoated material to protect the underlying photopolymer material from ultraviolet light attack.

20. The method according to claim 12 further comprising using a nonconductive receiving surface as the receiving surface.

21. A method of xeroprinting with a toned pattern utilizing a suspension of electrostatically charged toner particles in a carrier liquid to create a developed electrostatic image on a photopolymer master mounted to a conductive substrate, comprising the steps of:
  (a) coating the photopolymer with a low friction protective overcoated material;
  (b) imagewise exposing the photopolymer master to actinic radiation to form a permanent latent image of increased electrostatic resistivity in the exposed areas;
  (c) charging the protective overcoated material;
  (d) developing the latent image by applying charged liquid electrophotographic toner particles to the protective overcoated material so that the toner particles are maintained above the unexposed areas as a function of the time between charging and developing, the duration of the charging and the time constant of the exposed and unexposed areas; and
  (e) transferring the toner particles from the protective overcoated material to a receiving surface.

22. The method according to claim 21 further comprising including an ultraviolet absorber in the protective overcoated material to protect the underlying photopolymer material from ultraviolet light attack.

23. The method according to claim 21 further comprising using a nonconductive laminate on which is mounted the receiving surface.

24. The method according to claim 22 further comprising using a conductive receiving surface as the receiving surface.

25. The method according to claim 21 further comprising using a nonconductive receiving surface as the receiving surface.

26. The method according to claim 21 further comprising using a liquid photopolymer as the photopolymer material and drying it after coating the conductive substrate.

27. The method according to claim 21 further comprising using a dry film photoresist as the photopolymer material.

28. The method according to claim 21 further comprising using a material as the protective overcoated material selected from the group consisting of polyethylene terephthalate, polyvinyl fluoride, polyvinylidene fluoride, polyether polyurethane, polyester polyurethane, polybutylene terephthalate, polyoxymethylene, and polyether ether ketone.

* * * * *